United States Patent
Saito et al.

(10) Patent No.: US 7,498,618 B2
(45) Date of Patent: Mar. 3, 2009

(54) NITRIDE SEMICONDUCTOR DEVICE

(75) Inventors: Wataru Saito, Kanagawa-ken (JP);
Masaaki Onomura, Tokyo (JP); Akira Tanaka, Kanagawa-ken (JP); Koichi Tachibana, Kanagawa-ken (JP);
Masahiko Kuraguchi, Kanagawa-ken (JP); Takao Noda, Kanagawa-ken (JP);
Tomohiro Nitta, Kanagawa-ken (JP);
Akira Yoshioka, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 170 days.

(21) Appl. No.: 11/507,493

(22) Filed: Aug. 22, 2006

(65) Prior Publication Data
US 2007/0051977 A1 Mar. 8, 2007

(30) Foreign Application Priority Data
Aug. 24, 2005 (JP) .............................. 2005-242637

(51) Int. Cl.
*H01L 29/778* (2006.01)
(52) U.S. Cl. ................................ 257/194; 257/E29.252
(58) Field of Classification Search ................. 257/192, 257/194, E29.252, E29.253
See application file for complete search history.

(56) References Cited
U.S. PATENT DOCUMENTS
2005/0274977 A1   12/2005   Saito et al.
2006/0017064 A1*  1/2006   Saxler et al. ................. 257/194
2006/0170003 A1   8/2006   Saito et al.
2007/0051977 A1   3/2007   Saito et al.

OTHER PUBLICATIONS

U.S. Appl. No. 11/739,874, filed Apr. 25, 2007, Saito et al.
F. Udrea, et al., "Membrane High Voltage Devices-A Milestone Concept in Power ICs", Technical Digest in Inter. Electron Device Meeting (IEDM), Dec. 2004, pp. 451-454.
U.S. Appl. No. 12/145,980, filed Jun. 25, 2008, Saito.

* cited by examiner

*Primary Examiner*—Evan Pert
*Assistant Examiner*—Kevin Quinto
(74) *Attorney, Agent, or Firm*—Oblon, Spivak, McClelland, Maier & Neustadt, P.C.

(57) ABSTRACT

A nitride semiconductor device comprises: a substrate body including a conductive substrate portion and a high resistance portion; a first semiconductor layer of a nitride semiconductor provided on the substrate body; a second semiconductor layer provided on the first semiconductor layer; a first main electrode provided on the second semiconductor layer; a second main electrode provided on the second semiconductor layer; and a control electrode provided on the second semiconductor layer between the first main electrode and the second main electrode. The second semiconductor layer is made of a nondoped or n-type nitride semiconductor having a wider bandgap than the first semiconductor layer. The first main electrode is provided above the conductive portion and the second main electrode is provided above the high resistance portion.

19 Claims, 21 Drawing Sheets

NITRIDE SEMICONDUCTOR DEVICE

CROSS-REFERENCE TO RELATED APPLICATIONS

This application is based upon and claims the benefit of priority from the prior Japanese Patent Application No. 2005-242637, filed on Aug. 24, 2005; the entire contents of which are incorporated herein by reference.

BACKGROUND OF THE INVENTION

1. Field of the Invention

This invention relates to a nitride semiconductor device, and more particularly to a nitride semiconductor device having the structure of a heterojunction field effect transistor.

2. Background Art

Circuits such as switching power supplies and inverters are based on power semiconductor devices including switching devices and diodes, which are required to have such characteristics as high breakdown voltage and low on-resistance ($R_{ON}$). There is a tradeoff relation between the breakdown voltage and the on-resistance ($R_{ON}$), which relation depends on the device material. With the progress of technology development, the on-resistance ($R_{ON}$) of power semiconductor devices is reduced to nearly the limit for silicon (Si), which has been the main device material. For further reduction of on-resistance ($R_{ON}$), the device material needs to be changed. For example, wide bandgap semiconductors such as gallium nitride (GaN), aluminum gallium nitride (AlGaN), and other nitride semiconductors and silicon carbide (SiC) can be used as switching device materials to improve the tradeoff relation determined by the material, thereby dramatically reducing on-resistance ($R_{ON}$).

On the other hand, nitride semiconductors such as GaN and AlGaN can be used for heterojunction field effect transistors (HFETs) based on the AlGaN/GaN heterostructure. HFETs can achieve low on-resistance through the high mobility of the heterointerface channel and the high electron concentration due to piezopolarization caused by heterointerface strain.

Such a nitride semiconductor device can be made on a substrate such as sapphire ($Al_2O_3$) or SiC. However, the sapphire substrate has poor heat dissipation because of its large thermal resistance. On the other hand, while the SiC substrate is superior in heat dissipation, it has a high manufacturing cost, and it is technically difficult to fabricate a large-diameter substrate. In light of these circumstances, it is desirable from a comprehensive viewpoint to use a silicon (Si) substrate, which is relatively superior in heat dissipation, low-cost, and capable of achieving a large-diameter wafer.

However, Si and the AlGaN/GaN heterostructure are greatly different in lattice constant. For this reason, strain-induced cracks are likely to occur, and the thickness of a GaN layer that can be crystal grown without cracks is limited to about 1 to 2 micrometers. The maximum breakdown voltage of a GaN-HFET is determined by the thickness of the GaN layer. Typically, when a GaN-HFET device is formed on a conductive substrate, a voltage is applied between the drain electrode and the substrate. Therefore the device breakdown voltage strongly depends on the film thickness of the GaN layer. Because the critical electric field of GaN is about 3.3 MV/cm, the maximum device breakdown voltage is 330 volts when the film thickness of the GaN layer is 1 micrometer. For example, a film thickness of 2 micrometers or more is needed for obtaining a breakdown voltage of 600 volts or more.

On the other hand, some conventional techniques have been proposed for obtaining a high-quality GaN film free from cracks and the like.

For example, JP2001-230410A discloses a technique for obtaining a high-quality GaN film by using selective lateral growth to form a GaN crystal in the region where the electric field is concentrated during operation.

An article titled "AlGaN—GaN HEMTs on Patterned Silicon (111) Substrate", IEEE Electron Device Letters, Vol. 26, No. 3, March 2005, discloses a technique for growing a crack-free GaN film on a silicon substrate by providing rectangular ridges thereon.

However, even when these techniques are used, it is extremely difficult to obtain a high-quality GaN film free from defects and cracks, where the GaN film has a film thickness of several micrometers or more for particular use in power semiconductor devices.

Thus, in order to achieve a GaN-HFET having a high breakdown voltage of 600 V or more formed on a Si substrate, it is urgent to develop a technique for forming a crack-free, good GaN film of several micrometers or more. Moreover, this is also important for high-frequency GaN devices as well as power semiconductor devices, because a thick GaN layer is needed to avoid the deterioration of operating speed due to parasite capacitance between the electrode and the substrate when a Si or other conductive substrate is used.

SUMMARY OF THE INVENTION

According to an aspect of the invention, there is provided a nitride semiconductor device comprising: a substrate body including a conductive substrate portion and a high resistance portion; a first semiconductor layer of a nitride semiconductor provided on the substrate body; a second semiconductor layer of a nondoped or n-type nitride semiconductor having a wider bandgap than the first semiconductor layer, the second semiconductor layer being provided on the first semiconductor layer; a first main electrode provided on the second semiconductor layer above the conductive portion; a second main electrode provided on the second semiconductor layer above the high resistance portion; and a control electrode provided on the second semiconductor layer between the first main electrode and the second main electrode.

According to other aspect of the invention, there is provided a nitride semiconductor device comprising: a conductive substrate portion; a first semiconductor layer provided on the conductive substrate portion, the first semiconductor layer being made of a nitride semiconductor and having a first region into which a high resistance portion is inserted; a second semiconductor layer of a nondoped or n-type nitride semiconductor having a larger bandgap than the first semiconductor layer, the second semiconductor layer being provided on the first semiconductor layer; a first main electrode provided on the second semiconductor layer above a region outside the first region; a second main electrode provided on the second semiconductor layer above the first region; and a control electrode provided on the second semiconductor layer between the first main electrode and the second main electrode.

According to other aspect of the invention, there is provided a nitride semiconductor device comprising: a conductive substrate having a missing part; a first semiconductor layer of a nitride semiconductor provided on the conductive substrate; a second semiconductor layer of a nondoped or n-type nitride semiconductor having a wider bandgap than the first semiconductor layer, the second semiconductor layer being provided on the first semiconductor layer; a first main electrode provided on the second semiconductor layer; a second main electrode provided on the second semiconductor layer above the missing part; and a control electrode provided on the second semiconductor layer between the first main electrode and the second main electrode.

BRIEF DESCRIPTION OF THE DRAWINGS

FIG. 10 shows a seventh example of the nitride semiconductor device in the present embodiment, where FIG. 11 shows an eighth example of the nitride semiconductor device in the present embodiment, where

DETAILED DESCRIPTION OF THE INVENTION

Embodiments of the invention will now be described with reference to the drawings.

Figure 1:
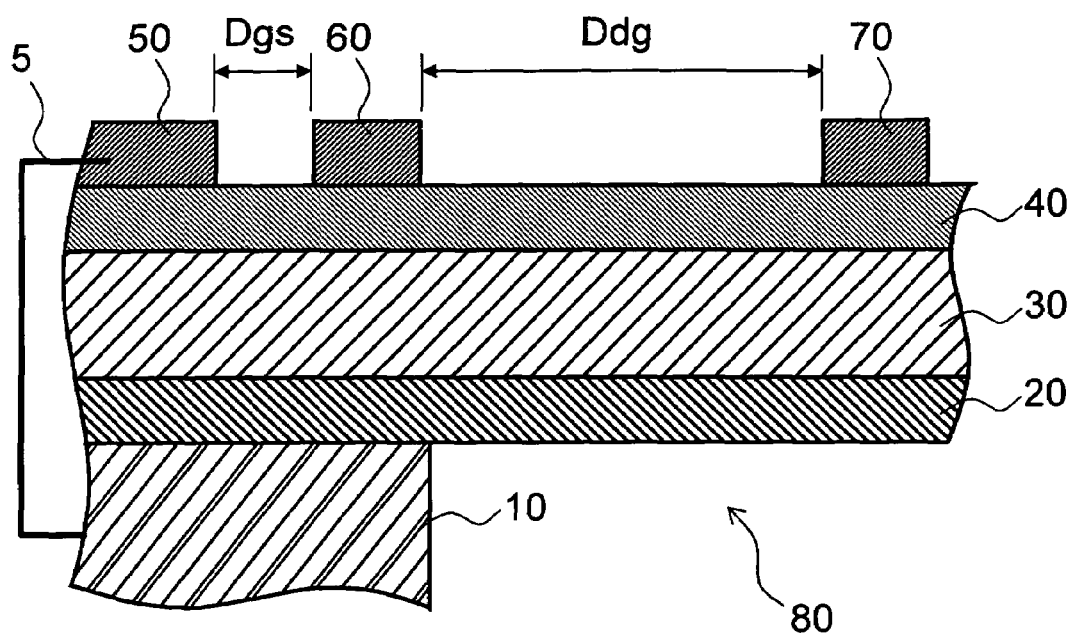
FIG. 1 is a cross section showing a first example of a nitride semiconductor device according to the present embodiment.
Figure 2:
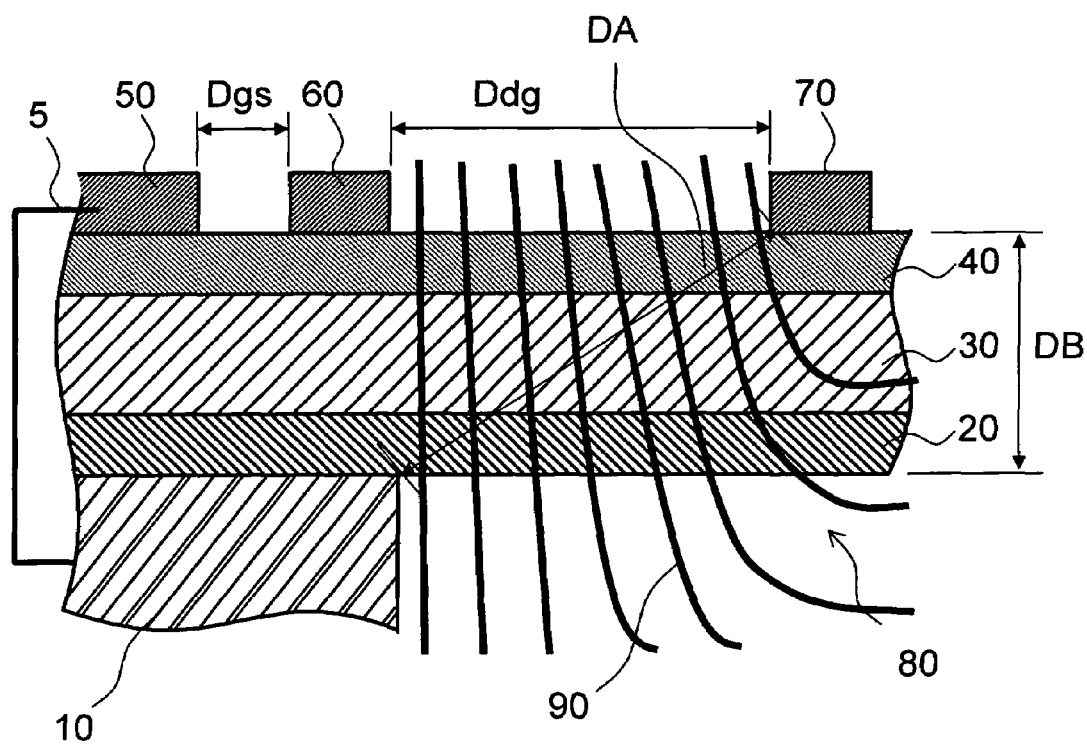
FIG. 2 is a schematic view for illustrating the operation of the nitride semiconductor device of the first example.

FIG. 1 is a cross section showing the structure of a first example of a nitride semiconductor device according to the present embodiment. FIG. 2 is a schematic view for illustrating the operation of the nitride semiconductor device of this example.

The nitride semiconductor device of this example has a structure in which a buffer layer 20, a channel layer 30, and a barrier layer 40, each made of nitride semiconductor, are laminated in this order on a Si substrate (conductive substrate portion) 10. The buffer layer 20 serves to alleviate lattice mismatch between the silicon substrate 10 and the channel layer 30. The channel layer 30 serves to drive carriers. The barrier layer 40 is formed from a nitride semiconductor having a larger bandgap than the channel 30, and serves to form two-dimensional electron gas (2DEG) at the interface with the channel layer 30.

The buffer layer 20 can illustratively be made of aluminum nitride (AlN), the channel layer 30 can illustratively be made of gallium nitride (GaN), and the barrier layer can illustratively be made of aluminum gallium nitride (AlGaN).

A gate electrode 60 to form a Schottky junction is provided on the major surface of the AlGaN barrier layer 40. The gate electrode 60 is interposed between a drain electrode 70 and a source electrode 50. Here, when the distance Ddg between the drain electrode 70 and the gate electrode 60 is longer than the distance Dgs between the gate electrode 60 and the source electrode 50 (Ddg>Dgs), a device having a high breakdown voltage is achieved.

In this example, the source electrode 50 is electrically connected to the conductive Si substrate 10, and the Si substrate 10 is absent directly below the drain electrode 70. The Si substrate 10 has a missing part (cavity) 80. More specifically, a high resistance portion (missing part or cavity) 80 is provided directly below the drain electrode 70. The high resistance portion 80 is actually air, ambient gas for sealing the chip, or vacuum, and more insulative with higher resistance than the Si substrate (conductive substrate portion) 10. In other words, in this structure, the GaN channel layer 30 and the like are provided on a substrate body composed of the Si substrate (conductive substrate portion) 10 and the high resistance portion 80.

Furthermore, the minimum distance DA between the drain electrode 70 and the Si substrate 10 is larger than the total film thickness DB of the nitride semiconductor layers below the drain electrode 70.

This structure can provide a nitride semiconductor device of the HFET structure having high breakdown voltage characteristic that does not depend on the film thickness of nitride semiconductor.

In the following, this point is described in detail with reference to a comparative example.

Figure 3:
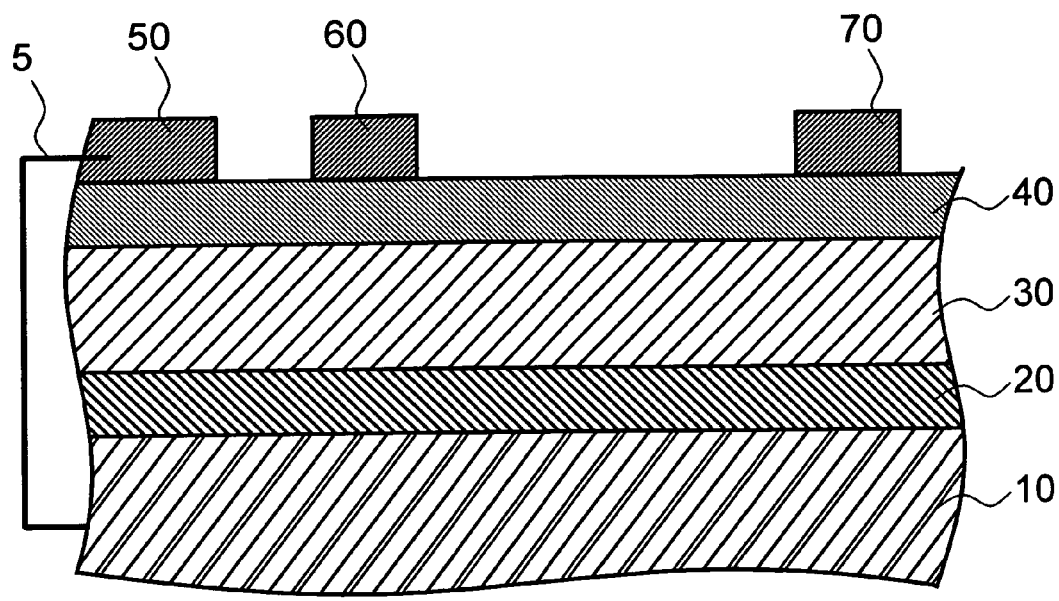
FIG. 3 is a cross section illustrating a nitride semiconductor device of a comparative example.

FIG. 3 is a cross section showing a nitride semiconductor device of a comparative example.

Figure 4:
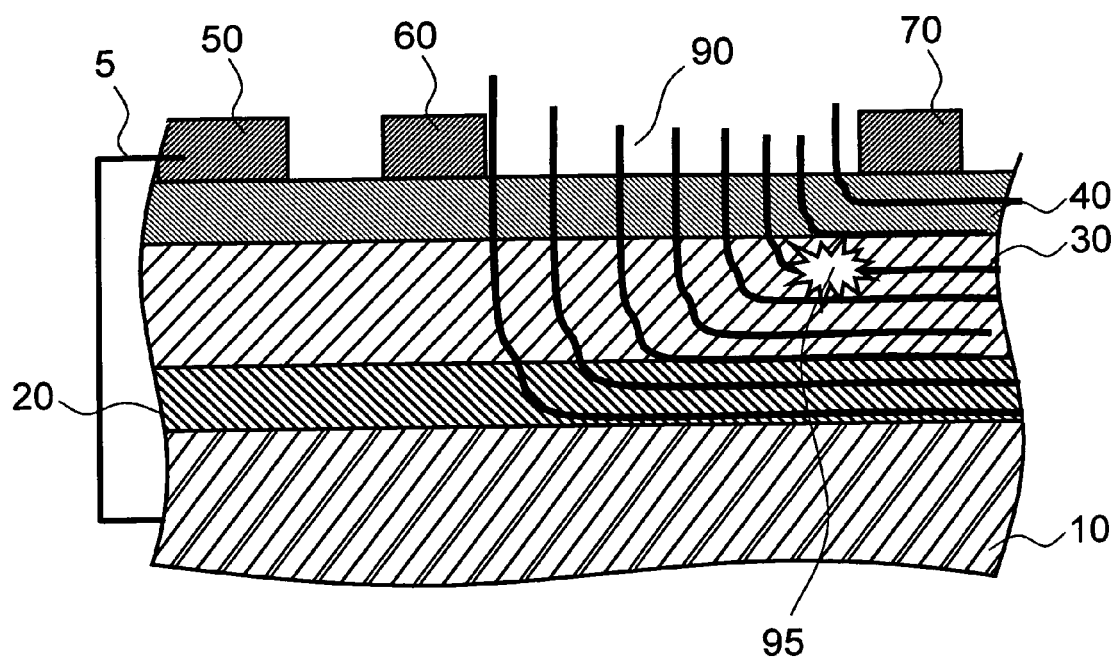
FIG. 4 is a schematic view for illustrating the operation of the nitride semiconductor device of the comparative example.

FIG. 4 is a schematic view for illustrating the operation of the nitride semiconductor device of the comparative example. Note that with regard to FIG. 3 and the following figures, elements similar to those described with reference to any previous figure are marked with the same reference numerals and not described in detail as appropriate.

As shown in FIG. 3, in the semiconductor device of the comparative example, an AlN layer 20, a GaN layer 30, and an AlGaN layer 40 are laminated in this order on a Si substrate 10, and then electrodes are provided to have a positional relationship similar to that described above. Thus, the Si substrate 10 is present also directly below the drain electrode 70.

As shown in FIG. 4, in the device of the comparative example, when a bias is applied between the drain electrode 70 and the source electrode 50, equipotential lines 90 occur between the AlN layer 20 and the AlGaN layer 40 in a generally horizontal direction relative to the major surface. More specifically, because a voltage is applied between the drain electrode 70 and the directly underlying Si substrate 10, the device breakdown voltage depends on the film thickness of the GaN channel layer 30. The critical electric field of the GaN channel layer 30 is about 3.3 MV/cm, and the film thickness that can be grown without cracks and the like on the Si substrate 10 is only about 1 micrometer. That is, in this comparative example, the maximum device breakdown voltage is about 330 volts. However, the device breakdown voltage required for HFETs in power applications and the like is 600 volts or more. Thus, in the comparative example, the device breakdown voltage is insufficient. Application of a voltage as high as 600 volts would exceed the critical voltage of the GaN channel layer 30 and cause a breakdown 95.

In contrast, according to the present embodiment, the Si substrate 10 is absent directly below the drain electrode 70. Therefore, as shown in FIG. 2, when a bias is applied between the drain electrode 70 and the source electrode 50, equipotential lines 90 occur between the AlN layer 20 and the AlGaN layer 40 in a generally vertical direction relative to the major surface. That is, because the voltage is applied between the edge of the Si substrate 10 and the drain electrode 70 spaced apart at a distance DA, the electric field in the GaN channel layer 30 is significantly alleviated. As a result, a high breakdown voltage of several hundreds of volts or more can be achieved even when the film thickness of the GaN channel layer 30 is small.

A method of forming the nitride semiconductor device of this embodiment may illustratively be as follows. An AlN layer 20, a GaN layer 30, and an AlGaN layer 40 are grown in this order on a Si substrate 10. Then, from the rear face of the Si substrate 10, desired features are patterned and etched to selectively remove the Si substrate 10. Here, the source electrode 50, the gate electrode 60, and the drain electrode 70 may be formed before or after the step of etching the Si substrate 10.

In this example, the buffer layer 20 can use various structures such as a superlattice structure where AlN or AlGaN layers and GaN layers are alternately laminated, or a laminated structure of an AlN layer and a 3C—SiC layer.

In this embodiment, the thickness of the GaN channel layer 30 can be small. Hence, even when it is epitaxially grown on the Si substrate, wafer "bowing" is less likely to occur. Thus the AlN buffer layer 20 can be grown at high temperatures, instead of at low temperatures. Growing the AlN buffer layer 20 at high temperatures has an advantage of improving the crystallinity of the GaN channel layer and the AlGaN barrier layer 40.

Furthermore, this embodiment can be carried out irrespective of the conductivity type and resistivity of the Si substrate 10. For example, use of a low-resistance, p-type Si substrate 10 has an advantage of improving avalanche breakdown capability because holes generated by avalanche breakdown due to the application of high voltage can be ejected from the Si substrate 10.

Next, other examples of the nitride semiconductor device in this embodiment are described.

Figure 5:
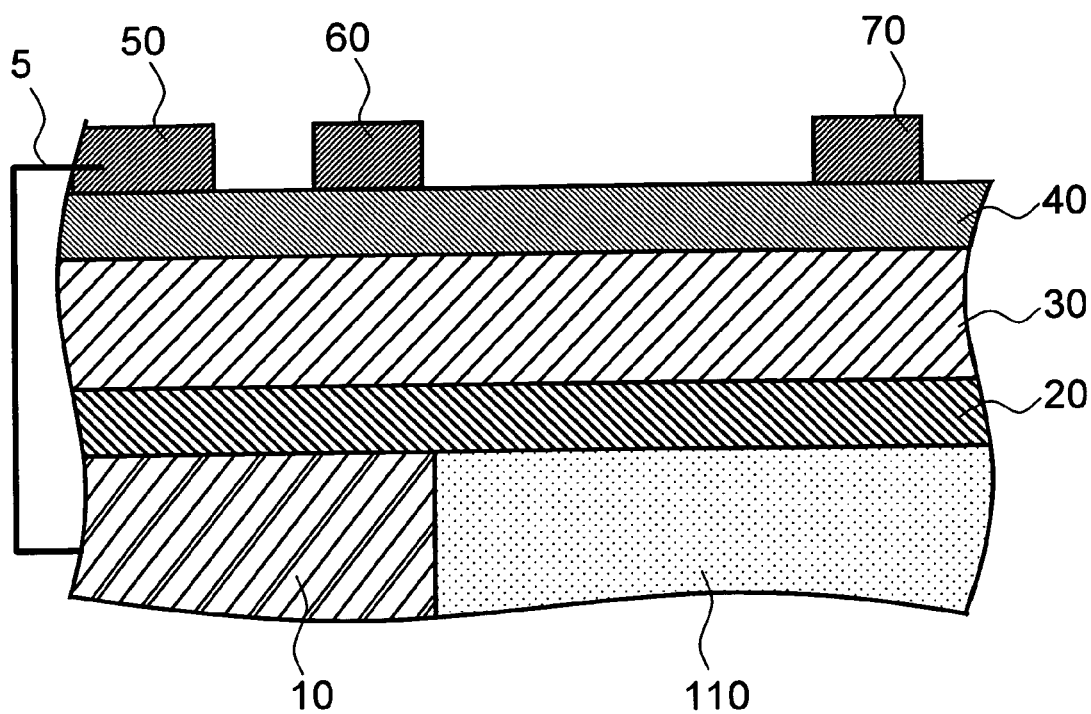
FIG. 5 is a cross section showing a second example of the nitride semiconductor device in the present embodiment.

FIG. 5 is a cross section showing a second example of the nitride semiconductor device in the present embodiment.

In this example, an insulator (high resistance portion) 110 is packed directly below the drain electrode 70. That is, the GaN channel layer 30 and the like are provided on a substrate body composed of the Si substrate (conductive substrate portion) 10 and the high resistance portion 110.

This structure can also achieve a high breakdown voltage even when the film thickness of the GaN layer 30 is small, as with the structures described above with reference to FIGS. 1 to 4. Furthermore, because the portion below the drain electrode 70 is filled, the mechanical strength of the nitride semiconductor device is improved. The insulator 110 can be made of inorganic materials such as silicon oxide ($SiO_2$) and organic materials such as polyimides. When silicon oxide is used as the insulator 110, it can also be formed in a process where the Si substrate 10 below the drain electrode 70 is thinned to some extent and then selectively oxidized.

Figure 6:
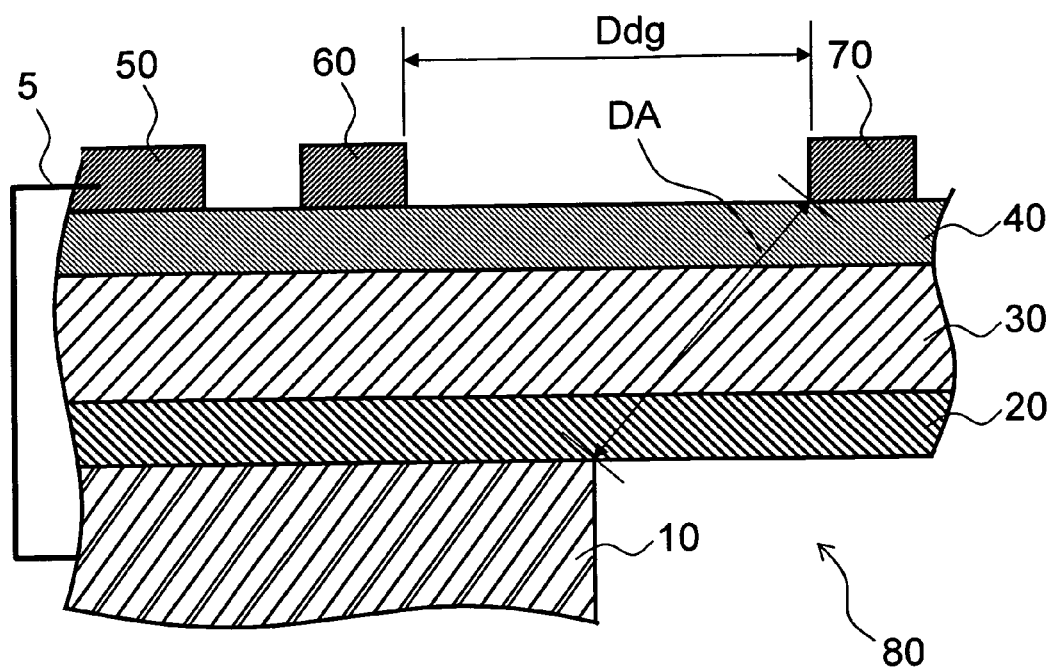
FIG. 6 is a cross section showing a third example of the nitride semiconductor device in the present embodiment.

FIG. 6 is a cross section showing a third example of the nitride semiconductor device in the present embodiment.

In this example, the removed region of the Si substrate 10 is determined so that the minimum distance DA between the drain electrode 70 and the Si substrate 10 is more than half the distance Ddg between the drain electrode 70 and the gate electrode 60 (DA>Ddg/2). This can ensure a high breakdown voltage irrespective of the film thickness of the GaN channel layer 30. More specifically, as shown in FIG. 6, the Si substrate 10 is brought closer to the drain electrode 70 than to the edge of the gate electrode 60 to serve as a field plate electrode, thereby alleviating the electric field at the edge of the gate electrode 60. Thus a high breakdown voltage can be achieved. In addition, the high resistance portion (missing part or cavity) 80 formed by thus removing the Si substrate 10 may be filled with insulator as described above with reference to FIG. 5.

Figure 7:
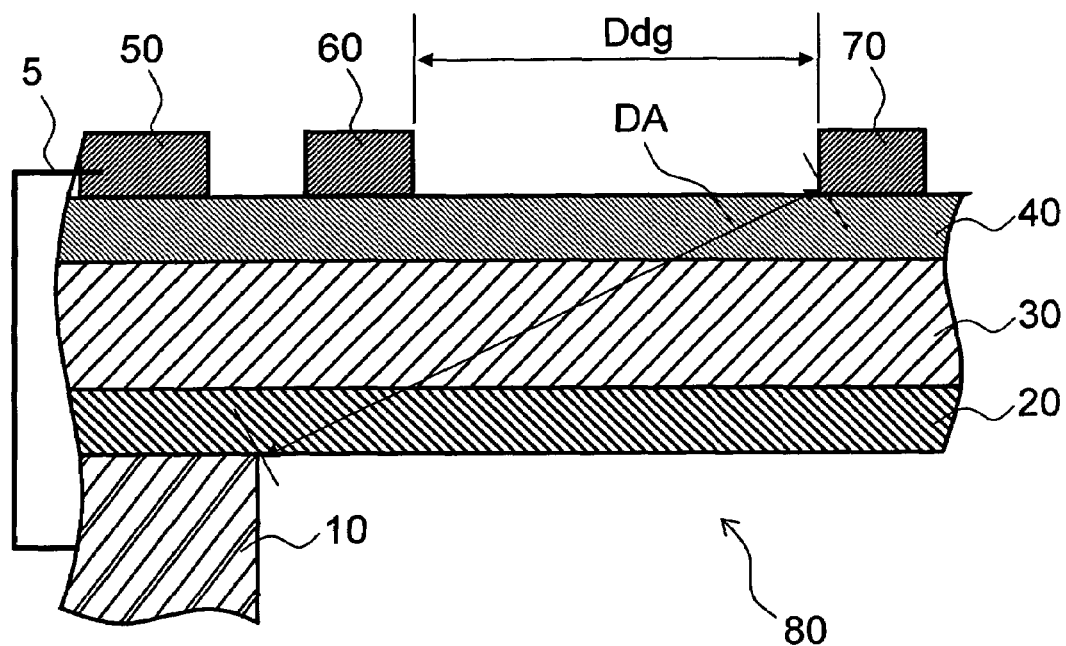
FIG. 7 is a cross section showing a fourth example of the nitride semiconductor device in the present embodiment.

FIG. 7 is a cross section showing a fourth example of the nitride semiconductor device in the present embodiment.

In this example, the removed region of the Si substrate 10 extends not only below the drain electrode 70 but also below the gate electrode 60. That is, the distance DA between the drain electrode 70 and the Si substrate 10 is more than the distance Ddg between the drain electrode 70 and the gate electrode 60. This can further ensure a high breakdown voltage irrespective of the film thickness of the GaN channel layer 30. In this example again, the high resistance portion 80 formed by removing the Si substrate 10 may be filled with insulator as described above with reference to FIG. 5.

Figure 8:
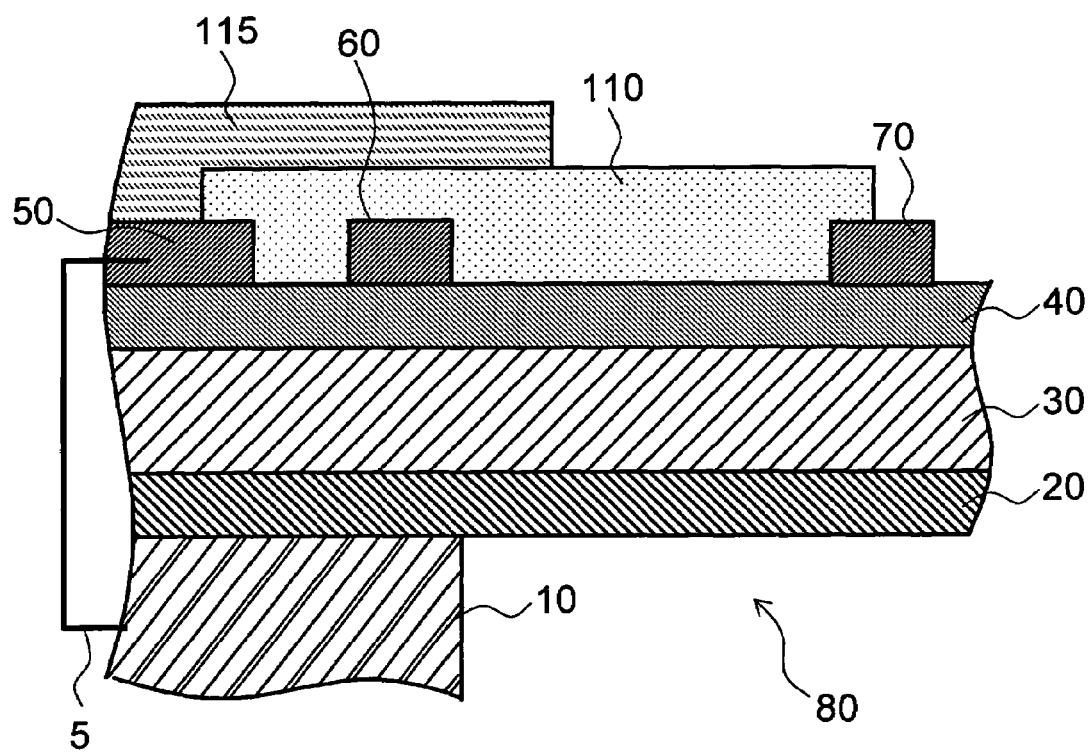
FIG. 8 is a cross section showing a fifth example of the nitride semiconductor device in the present embodiment.

FIG. 8 is a cross section showing a fifth example of the nitride semiconductor device in the present embodiment.

In this example, the gate electrode 60 and the gate electrode side of the source electrode 50 and the drain electrode 70 are covered with an insulator 110. Furthermore, on the surface of the insulator 110, a field plate electrode 115 connected to the source electrode 50 extends to overlie the gate electrode 60.

The field plate electrode 115 can alleviate electric field concentration at the edge of the gate electrode 60 and achieve a high breakdown voltage. The field plate electrode 115 can be connected to the gate electrode 60 instead of being connected to the source electrode 50 to achieve similar effects. Furthermore, the Si substrate 10 can also function similarly to the field plate electrode 115. More specifically, the Si substrate 10 connected to the source electrode 50 and formed to underlie the gate electrode 60 can function as a field plate and alleviate electric field concentration at the edge of the gate electrode 60, thereby achieving a higher breakdown voltage.

Figure 9:
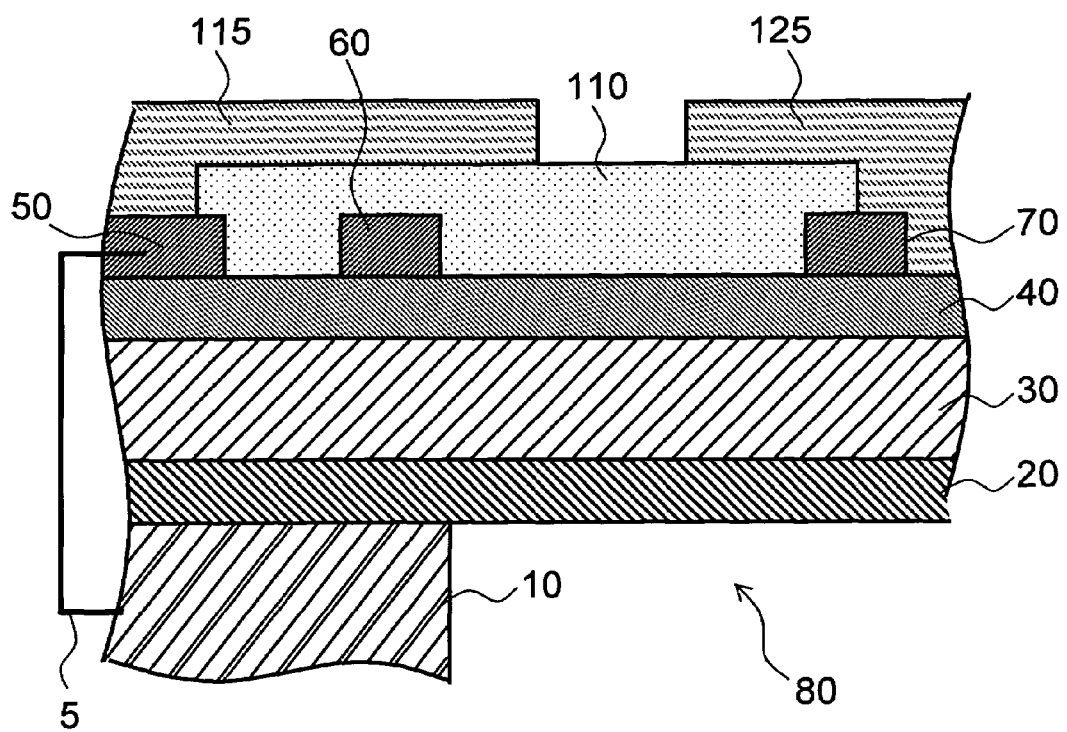
FIG. 9 is a cross section showing a sixth example of the nitride semiconductor device in the present embodiment.

FIG. 9 is a cross section showing a sixth example of the nitride semiconductor device in the present embodiment.

In this example, in addition to the field plate electrode 115 described above with reference to FIG. 8, a second field plate electrode 125 connected to the drain electrode 70 is provided on the insulating film 110 to extend toward the gate electrode 60. The second field plate electrode 125 can also alleviate electric field concentration at the edge of the drain electrode 70 as well as at the edge of the gate electrode 60. Thus a higher breakdown voltage can be achieved.

Figure 10A:
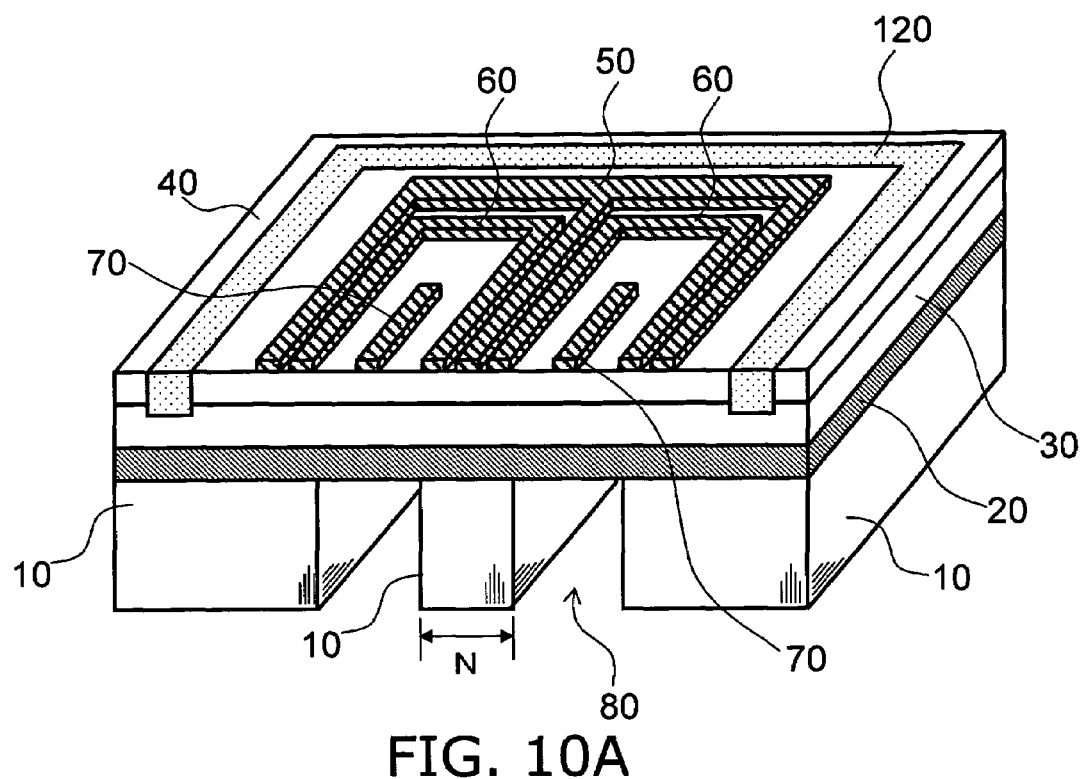
FIG. 10A is a cross-sectional perspective view.
Figure 10B:
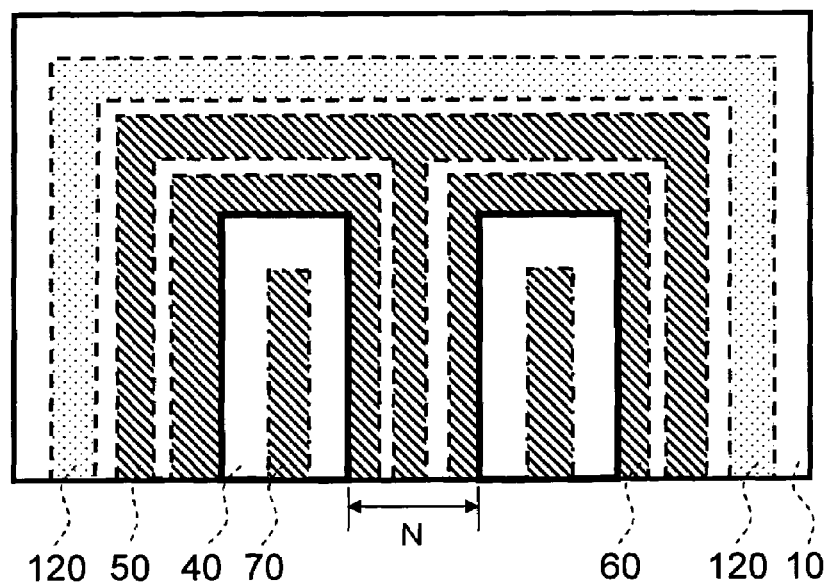
FIG. 10B is a perspective bottom view.

FIG. 10 shows a seventh example of the nitride semiconductor device in the present embodiment, where FIG. 10A is a cross-sectional perspective view, and FIG. 10B is a perspective bottom view.

In this example, two parallel striped drain electrodes 70 are surrounded by gate electrodes 60, respectively, and the two gate electrodes 60 are surrounded by one source electrode 50. Between the periphery of the AlGaN barrier layer 40 on its major surface and the source electrode 50, a device isolation layer 120 passes through the AlGaN barrier layer 40 and is buried into the GaN channel layer 30.

The Si substrate 10 below the regions of the drain electrodes 70 surrounded by the gate electrodes 60 is removed, where a high resistance portion (missing part or cavity) 80 is provided. The high resistance portion 80 is actually air, ambient gas for sealing the chip, or vacuum, and more insulative with higher resistance than the Si substrate (conductive substrate portion) 10. Between the regions of the high resistance portion 80, the Si substrate 10 is left behind with a width of N.

By removing the Si substrate 10 only in a portion of the chip in this manner, the breakdown voltage of the nitride semiconductor device can be improved while maintaining the mechanical strength of the semiconductor device. In particular, this example can further ensure the mechanical strength because the high resistance portion 80 formed by removing the Si substrate 10 is surrounded by the remaining Si substrate 10. In addition, the high resistance portion 80 can be filled entirely or locally with an insulator 110 as described above with reference to FIG. 5 to further improve the mechanical strength.

Figure 11A:
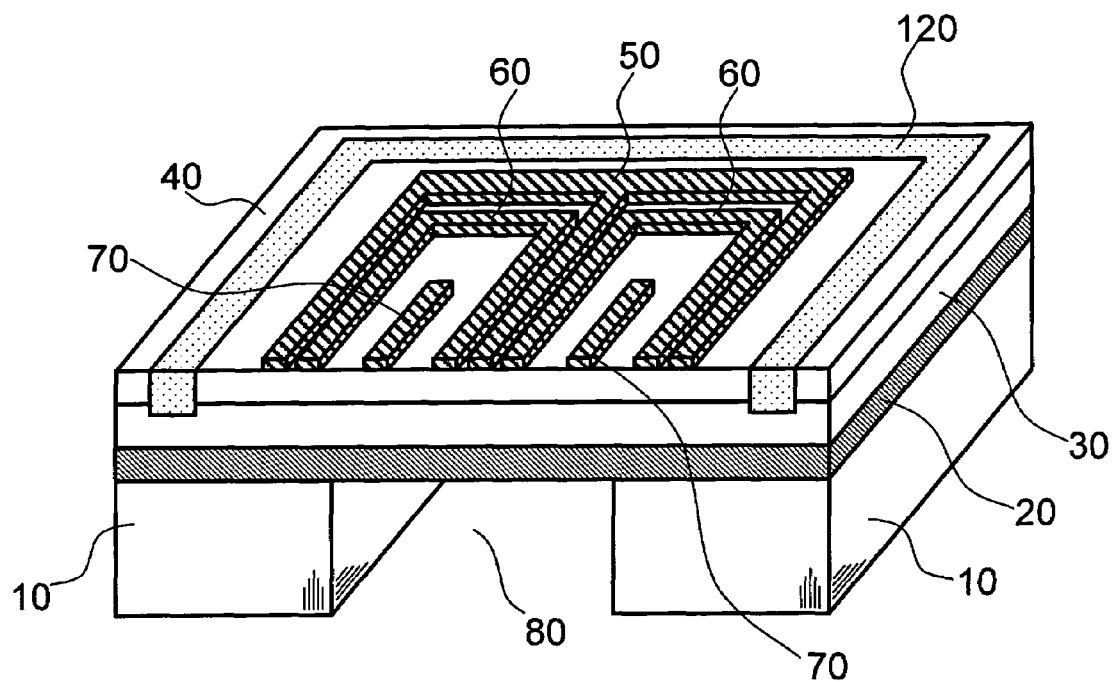
FIG. 11A is a cross-sectional perspective view.
Figure 11B:
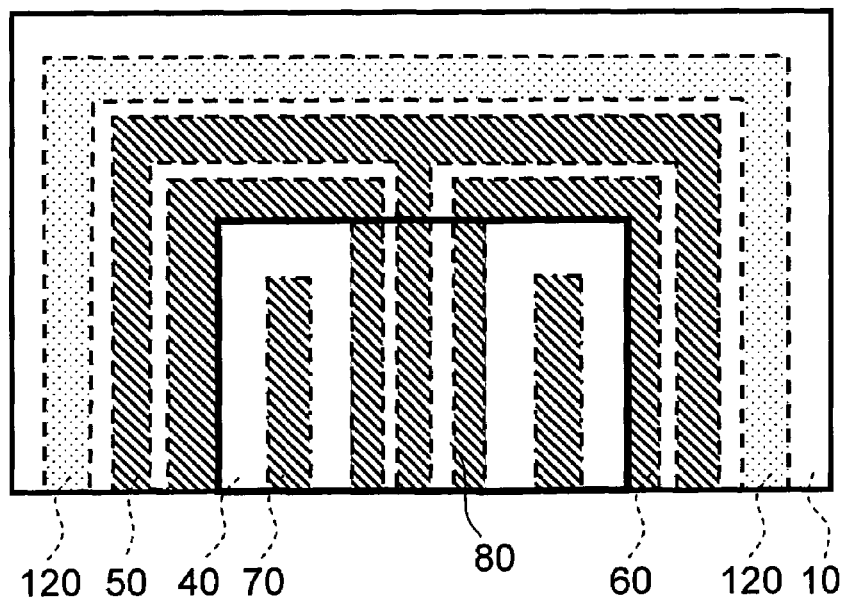
FIG. 11B is a perspective bottom view.

FIG. 11 shows an eighth example of the nitride semiconductor device in the present embodiment, where FIG. 11A is a cross-sectional perspective view, and FIG. 11B is a perspective bottom view.

This example has a similar structure to the example described above with reference to FIG. 10. However, in this example, the Si substrate 10 is removed below the region between the pair of drain electrodes 70, where a high resistance portion 80 is formed. That is, the Si substrate 10 is left behind only along the outer periphery of the chip. This structure can also improve the breakdown voltage while maintaining mechanical strength.

Figure 12:
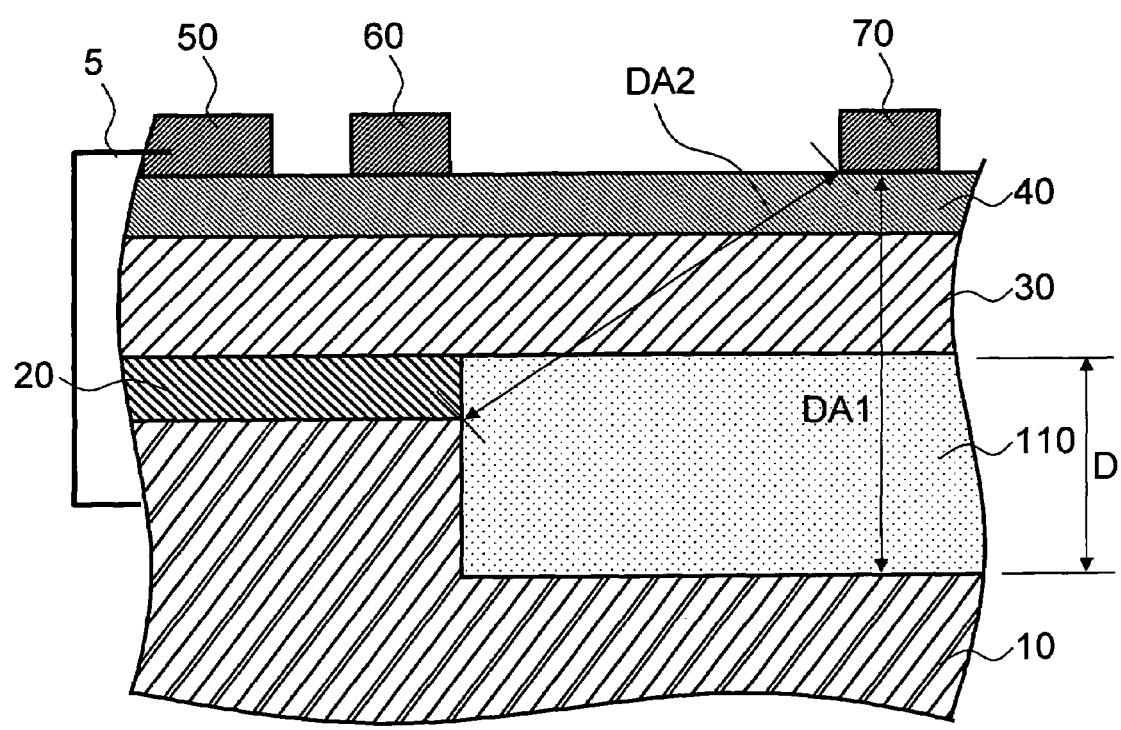
FIG. 12 is a cross section showing a ninth example of the nitride semiconductor device in the present embodiment.

FIG. 12 is a cross section showing a ninth example of the nitride semiconductor device in the present embodiment.

In this example, below the drain electrode 70, the GaN layer 30 and an upper portion of the Si substrate 10 are removed, where an insulator 110 is buried. That is, the GaN channel layer 30 and the like are provided on a substrate body composed of the Si substrate (conductive substrate portion) 10 and the high resistance portion 110.

Thus the minimum distance between the drain electrode 70 and the Si substrate 10 can be increased, thereby improving the breakdown voltage. More specifically, the thickness and position of the insulator 110 can be adjusted to increase both the minimum distance DA1 between the drain electrode 70 and the underlying Si substrate 10, and the minimum distance DA2 between the drain electrode 70 and the top edge of the Si substrate 10.

For example, when the insulator 110 is made of $SiO_2$, its critical electric field is comparable to that of the GaN layer 30. Therefore, in order to achieve a device breakdown voltage of 600 volts or more as described above, it is desirable that the thickness of the insulator 110 be generally 2 micrometers or more. Likewise, both the minimum distances DA1 and DA2 should be 2 micrometers or more. Thus the thickness and position of the insulator 110 can be adjusted to easily ensure a breakdown voltage as high as several hundreds of volts or more. At the same time, mechanical strength can be sufficiently ensured because the insulator 110 is packed.

The structure of this example can illustratively be formed by lateral growth of the GaN channel layer 30. More specifically, a trench as shown in FIG. 12 is formed in the Si substrate 10 by RIE (Reactive Ion Etching) or the like, and then the trench is filled with an insulator 110 by CVD (Chemical Vapor Deposition). Subsequently, an AlN buffer layer 20 is grown on the surface of the Si substrate 10 by MOCVD (Metal-Organic Chemical Vapor Deposition), hydride CVD, MBE (Molecular Beam Epitaxy), or the like. Here, epitaxial growth of AlN can be selectively carried out only on the surface of the Si substrate 10 without growing AlN on the insulator 110. Then a GaN channel layer 30 is epitaxially grown on the AlN buffer layer 20. Here, the GaN channel layer 30 can be grown by lateral epitaxy from the top of the AlN buffer layer 20 to the top of the insulator 110. Subsequently, an AlGaN barrier layer 40 is epitaxially grown on the GaN channel layer 30. Thus the laminated structure shown in FIG. 12 is achieved.

Figure 13:
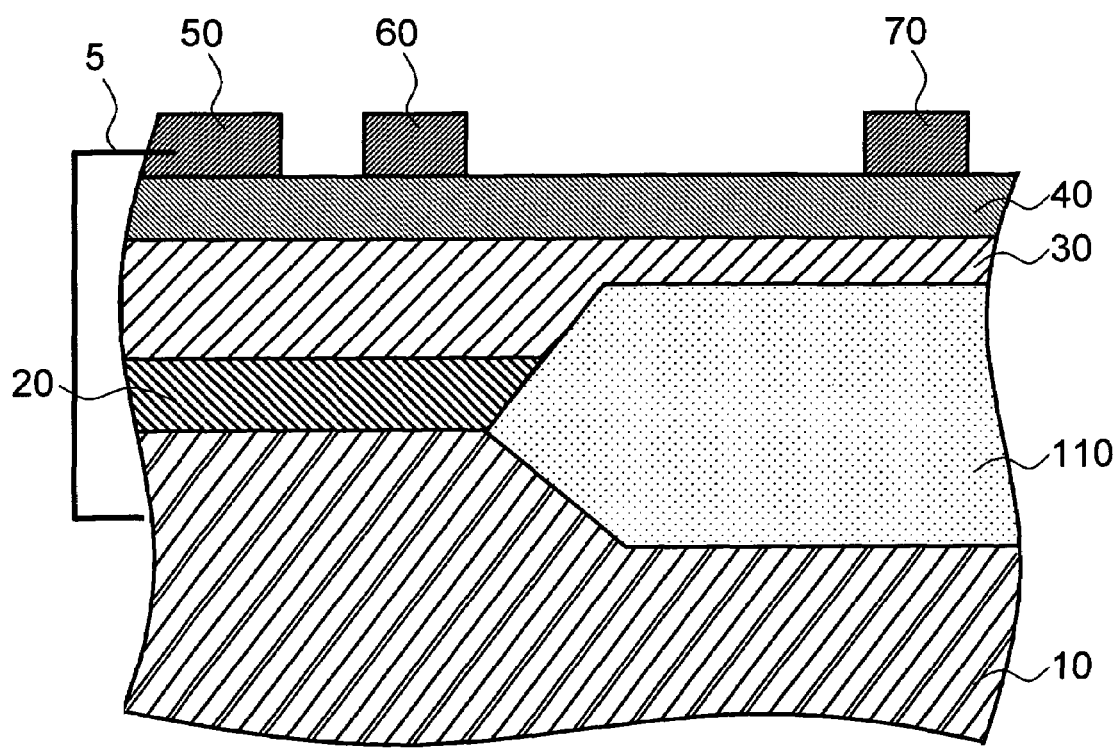
FIG. 13 is a cross section showing a tenth example of the nitride semiconductor device in the present embodiment.

FIG. 13 is a cross section showing a tenth example of the nitride semiconductor device in the present embodiment.

This example has a laminated structure similar to that described above with reference to FIG. 12, except that the cross-sectional configuration of the insulator 110 is different. The insulator 110 can illustratively be formed by selectively oxidizing the Si substrate 10. More specifically, the surface of the Si substrate 10 is partially masked with a silicon nitride film or the like, and then selectively oxidized by the LOCOS (Local Oxidation of Silicon) technique. Thus the insulator 110 can be formed. In this structure, lateral epitaxial growth of the GaN channel layer 30 can be facilitated because the edge of the insulator 110 has a relatively gradual slope. In this example again, the thickness and position of the insulator 110 can be appropriately adjusted to achieve a sufficiently high breakdown voltage.

Figure 14:
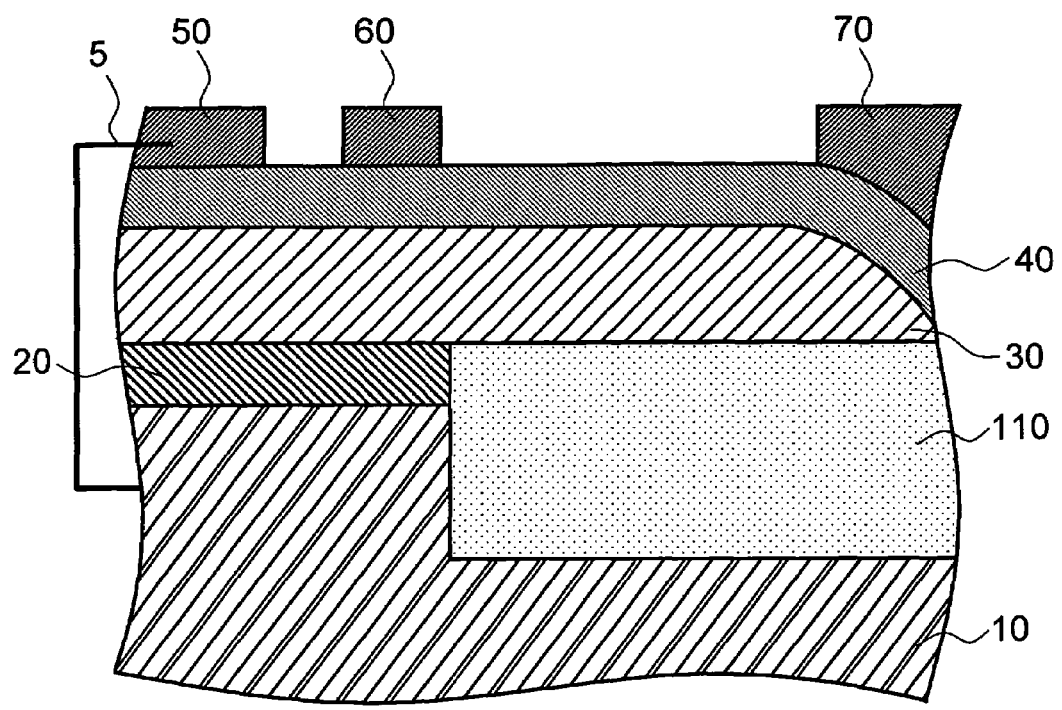
FIG. 14 is a cross section showing an eleventh example of the nitride semiconductor device in the present embodiment.

FIG. 14 is a cross section showing an eleventh example of the nitride semiconductor device in the present embodiment.

In this example, the GaN layer 30 is locally thinned under the drain electrode 70. This structure may illustratively occur in lateral epitaxial growth described above with reference to FIG. 12.

FIG. 15 is a cross section that schematically shows the process of lateral epitaxial growth.

Figure 15A:
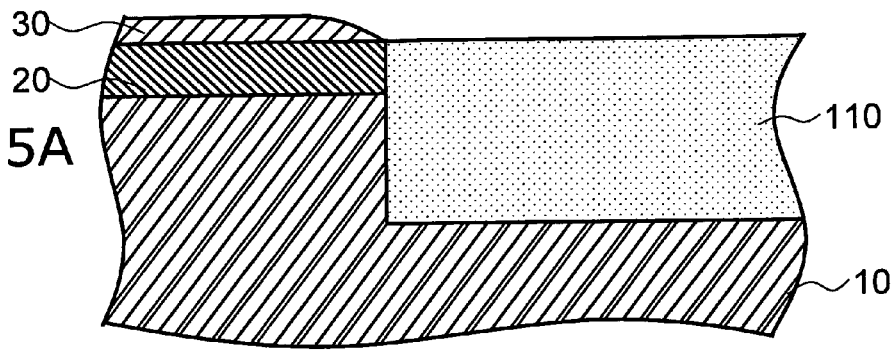
FIG. 15 is a cross section for illustrating the lateral epitaxial growth of the GaN channel layer 30.
Figure 15B:
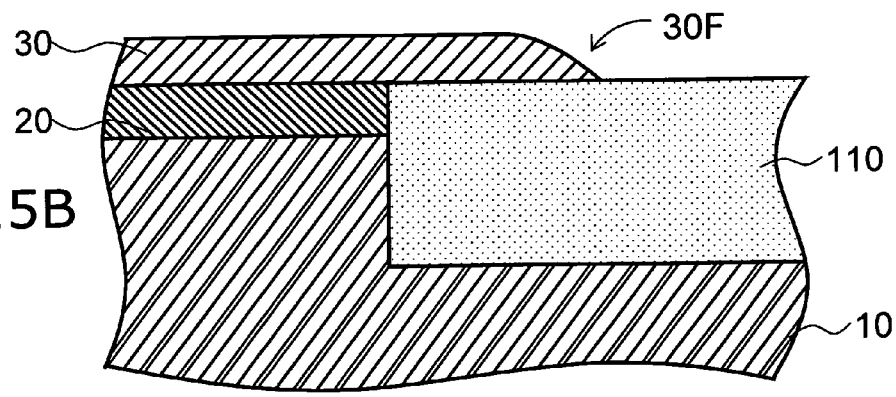
Figure 15C:
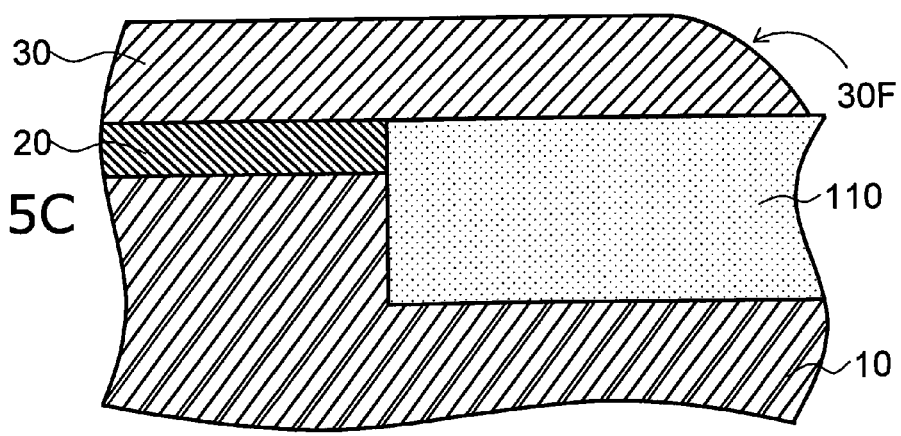

More specifically, lateral epitaxial growth begins by epitaxial growth of the GaN channel layer 30 on the crystalline AlN buffer layer 20 as shown in FIG. 15A. Then, as shown in FIGS. 15B and 15C, lateral epitaxial growth of the GaN channel layer 30 proceeds toward the top of the adjacent amorphous insulator 110.

Here, the growth front 30F of the GaN channel layer 30 that laterally proceeds on the insulator 110 has a small film thickness. However, according to this embodiment, the insulator 110 provided under the GaN channel layer 30 can be thick enough to retain the device breakdown voltage. That is, the thickness of the GaN channel layer 30 may be small. For this reason, as with the example shown in FIG. 14, the drain electrode 70 can be formed on the thin portion of the GaN channel layer 30.

Figure 16:
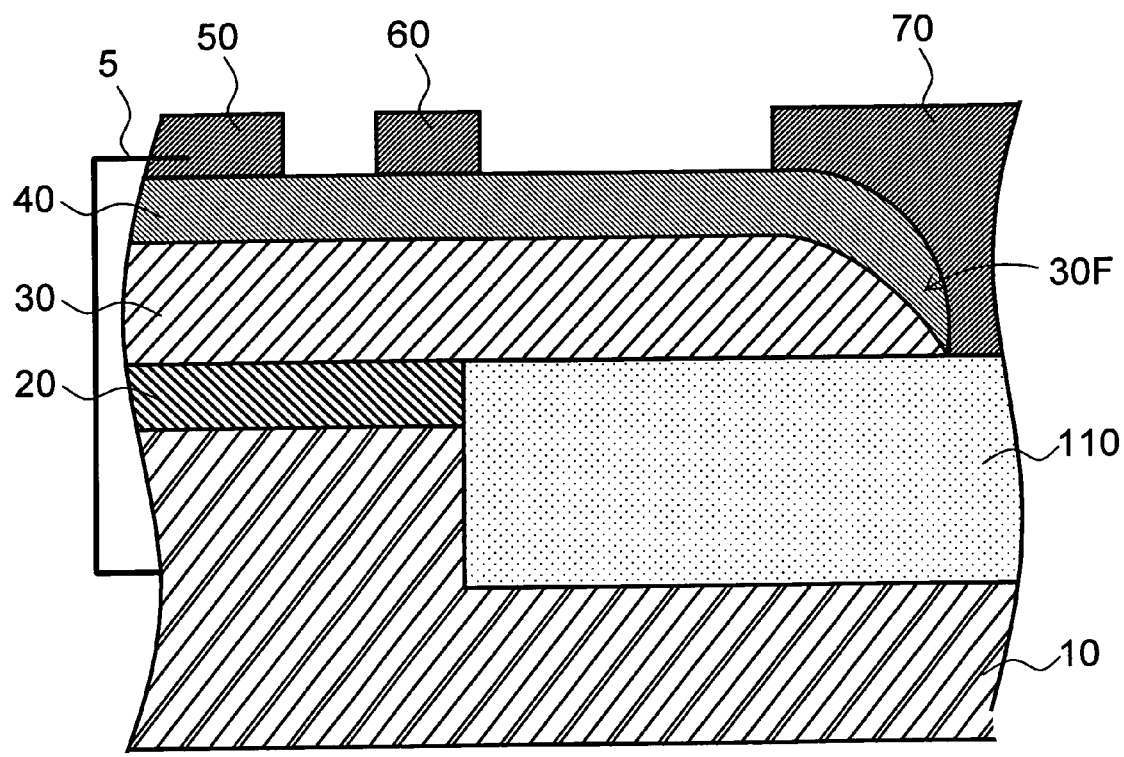
FIG. 16 is a cross section showing a twelfth example of the nitride semiconductor device in the present embodiment.

FIG. 16 is a cross section showing a twelfth example of the nitride semiconductor device in the present embodiment.

In this example, the drain electrode 70 extends into the portion where the GaN channel layer 30 is not formed, beyond the growth front of the GaN channel layer 30 grown by lateral epitaxy. According to this embodiment, because a sufficient breakdown voltage can be retained by the insulator 110 alone, the drain electrode 70 can be allowed to extend even into the portion where the GaN channel layer 30 is not formed.

Figure 17:
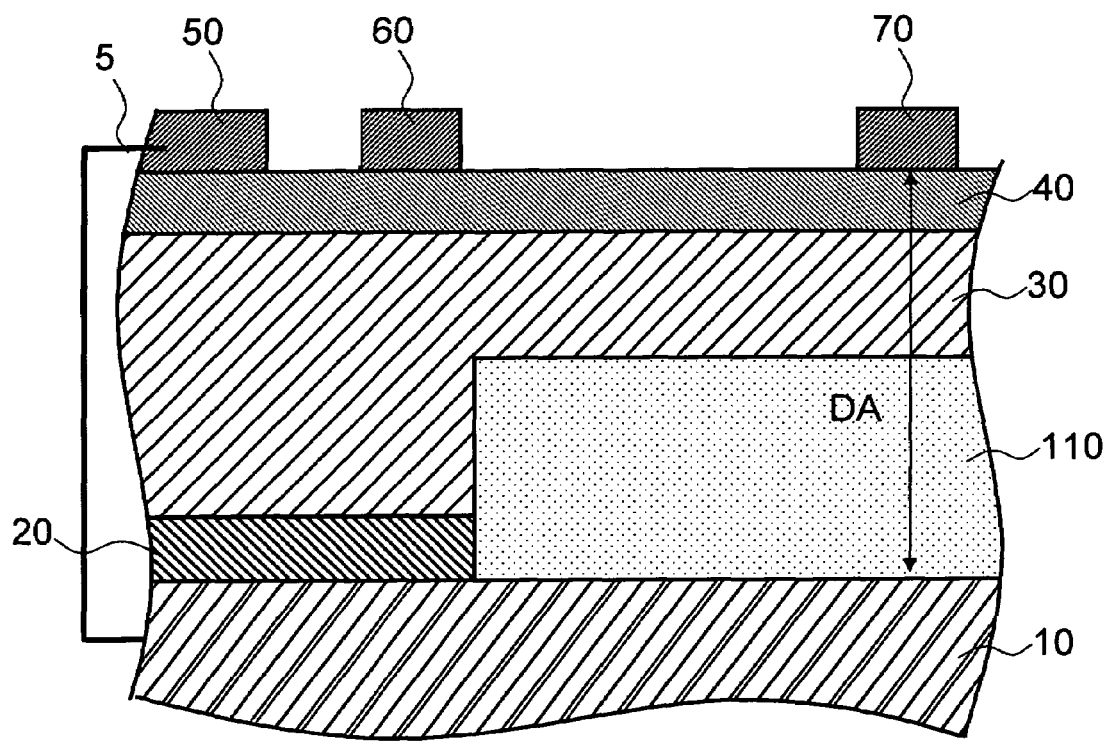
FIG. 17 is a cross section showing a thirteenth example of the nitride semiconductor device in the present embodiment.

FIG. 17 is a cross section showing a thirteenth example of the nitride semiconductor device in the present embodiment.

In this example, the insulator 110 is formed partially on the generally flat surface of the Si substrate 10. The GaN channel layer 30 and the AlGaN barrier layer 40 are laminated thereon, and then the drain electrode 70 is provided. That is, the GaN channel layer 30 and the like are provided on a substrate body composed of the Si substrate (conductive substrate portion) 10 and the high resistance portion 110.

In this structure again, the film thickness of the insulator 110 can be sufficiently increased to achieve a large distance DA between the drain electrode 70 and the Si substrate 10, thereby sufficiently increasing the device breakdown voltage. Thus a device having a high breakdown voltage can be achieved while reducing the film thickness of the GaN channel layer 30 under the drain electrode 70.

This structure can also be formed by lateral epitaxial growth. More specifically, first, an insulator 110 illustratively made of silicon oxide or silicon nitride is formed and patterned on the Si substrate 10. Thus the insulator 110 is partially formed. Next, an AlN buffer layer 20 is epitaxially grown on the partially exposed Si substrate 10. Here, the AlN buffer layer 20 can be grown by selective epitaxy so as to avoid growing on the insulator 110. Subsequently, a GaN channel layer 30 is epitaxially grown. Here, the GaN channel layer 30 starts lateral epitaxial growth on the insulator 110 when the thickness of the GaN channel layer 30 begins to exceed that of the insulator 110. Then, an AlGaN barrier layer 40 is epitaxially grown. Thus the laminated structure shown in FIG. 17 is achieved.

In the structure of this example, the GaN channel layer 30 has a large film thickness in the portion where the insulator 110 is absent, that is, in the portion under the source electrode 50. Therefore, in this portion, the GaN channel layer 30 may have a relatively low crystallinity. However, in normal use of HFETs, high electric field is not applied in the vicinity of the source electrode 50. Therefore, the breakdown voltage of the HFET is less likely to decrease even when the GaN channel layer 30 has a low crystallinity in the vicinity of the source electrode 50.

On the other hand, it is easy to achieve sufficiently good crystallinity in the GaN channel layer 30 grown by lateral epitaxy on the insulator 110. Therefore, no breakdown occurs even when a high electric field is applied in the vicinity of the drain electrode 70. Thus the breakdown voltage of an HFET can be increased. The insulator 110 shown in FIGS. 12 to 17 is not limited to a single film, but may be formed from a plurality of materials such as a combination of silicon oxide ($SiO_x$) and silicon nitride ($SiN_y$). Different insulators can be laminated to adjust the stress between the Si substrate 10 and the insulator 110, thereby canceling stress due to lattice strain between the Si substrate 10 and the nitride semiconductor layer 30. As a result, for example, the substrate bowing can also be reduced.

Figure 18:
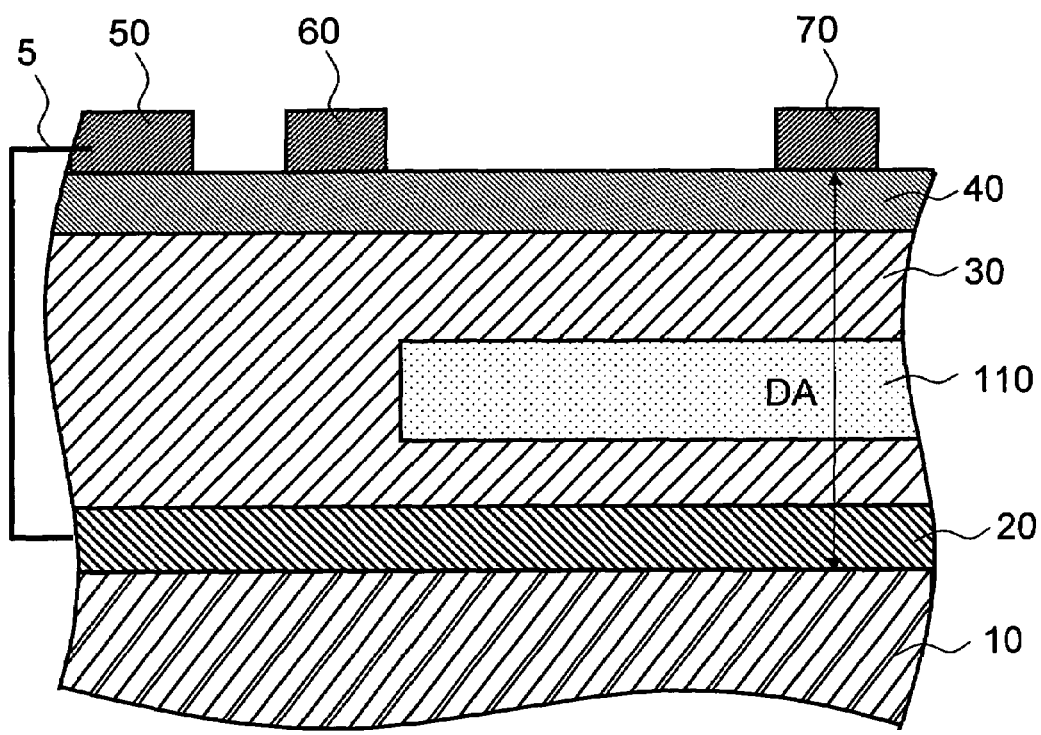
FIG. 18 is a cross section showing a fourteenth example of the nitride semiconductor device in the present embodiment.

FIG. 18 is a cross section showing a fourteenth example of the nitride semiconductor device in the present embodiment.

In this example, the insulator 110 is buried in the GaN channel layer 30 below the drain electrode 70. This structure can also achieve a sufficiently high breakdown voltage by increasing the distance DA between the drain electrode 70 and the Si substrate 10. The thickness of the insulator 110 only needs to be enough to retain the required device breakdown voltage. This structure can illustratively be formed as follows. An AlN buffer layer 20 and a portion of the GaN channel layer 30 are epitaxially grown on the Si substrate 10. Subsequently, an insulator 110 is selectively formed on the GaN channel layer 30. Then the remaining portion of the GaN channel layer 30 is grown thereon by lateral epitaxy.

Alternatively, an AlGaN layer or AlN layer may be buried in the GaN channel layer 30, and then selectively oxidized to form an insulator 110.

In this example again, the GaN channel layer 30 has a large film thickness below the source electrode 50, which may decrease the crystallinity. However, as described above with reference to FIG. 17, because this portion is not subjected to high electric field, there is little danger of decreasing the device breakdown voltage.

On the other hand, below the drain electrode 70, it is easy to maintain the good crystallinity of the GaN channel layer 30, and hence a high breakdown voltage can be retained.

Figure 19:
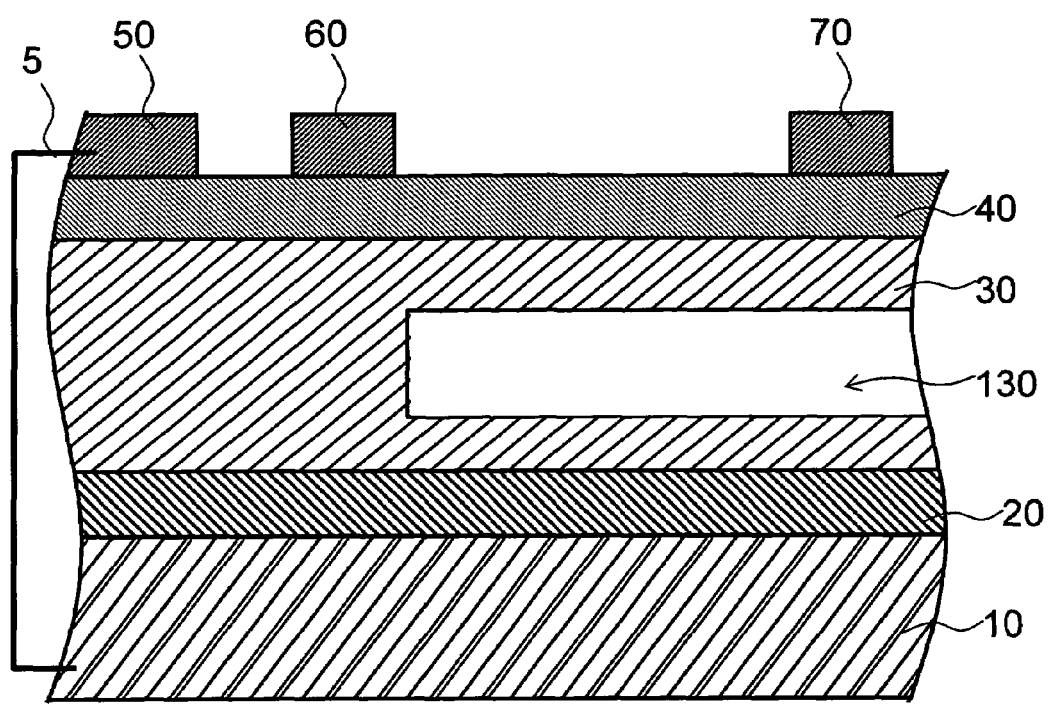
FIG. 19 is a cross section showing a fifteenth example of the nitride semiconductor device in the present embodiment.

FIG. 19 is a cross section illustrating a fifteenth example of the nitride semiconductor device in the present embodiment.

In this example, a cavity 130 is provided in the GaN channel layer 30 below the drain electrode 70. This structure enables the film thickness of the GaN channel layer 30 to be decreased because the cavity 130 can retain the voltage.

The cavity 130 can illustratively be formed by such methods as (1) forming a plurality of trench features on the surface of the GaN layer and annealing them under a hydrogen atmosphere, or (2) selectively burying an InGaN layer in the GaN layer and selectively etching away the InGaN layer by forming trenches from the surface of the GaN layer and annealing them under a hydrogen atmosphere.

Embodiments of the invention have been described with reference to the examples. However, the invention is not limited to these embodiments. The embodiments can also be combined, and embodiments adapted by those skilled in the art are also encompassed within the scope of the invention as long as they include the features of the invention.

The material, shape, patterning, and structure of each element constituting the inventive substrate and nitride semiconductor device that are adapted by those skilled in the art are also encompassed within the scope of the invention as long as they include the features of the invention.

For example, the embodiment of the invention uses a Si substrate for forming the GaN layer and AlGaN layer. However, a GaAs substrate can also be used. As long as the substrate is conductive, it is not limited to any specific substrate material and to its conductivity type.

While the combination of a GaN layer and an AlGaN layer is described, the same effects as described above can also be achieved by combinations of nitride semiconductors such as a pair of a GaN layer and an InGaN layer, a pair of an AlN layer and an AlGaN layer, and a pair of a BAlN layer and a GaN layer.

While the combination of an undoped AlGaN layer and an undoped GaN layer is used in the embodiment of the invention, the combination of an n-type AlGaN layer and an undoped GaN layer can also be used.

While AlN is used for the buffer layer sandwiched between the Si substrate and the GaN channel layer, a lattice-like combination of AlN and GaN, or of AlGaN and GaN, or a laminated structure of AlN and 3C—SiC, can also be used for the buffer layer.

The structures of the examples can be combined with each other as long as technically feasible, and any nitride semiconductor devices obtained by such combinations are also encompassed within the scope of the invention.

Furthermore, the gate-drain structure of the HFET used in the embodiment of the invention is similar to the structure of a hetero-Schottky barrier diode (HSBD). Therefore an HSBD with high breakdown voltage is achieved using this embodiment.

The gate electrode in the examples described above forms a Schottky junction. However, a MIS (Metal-Insulator-Semiconductor) gate structure, which is obtained by forming a gate insulating film between the gate electrode and the AlGaN barrier layer, can also achieve avalanche breakdown capability.

Figure 20:
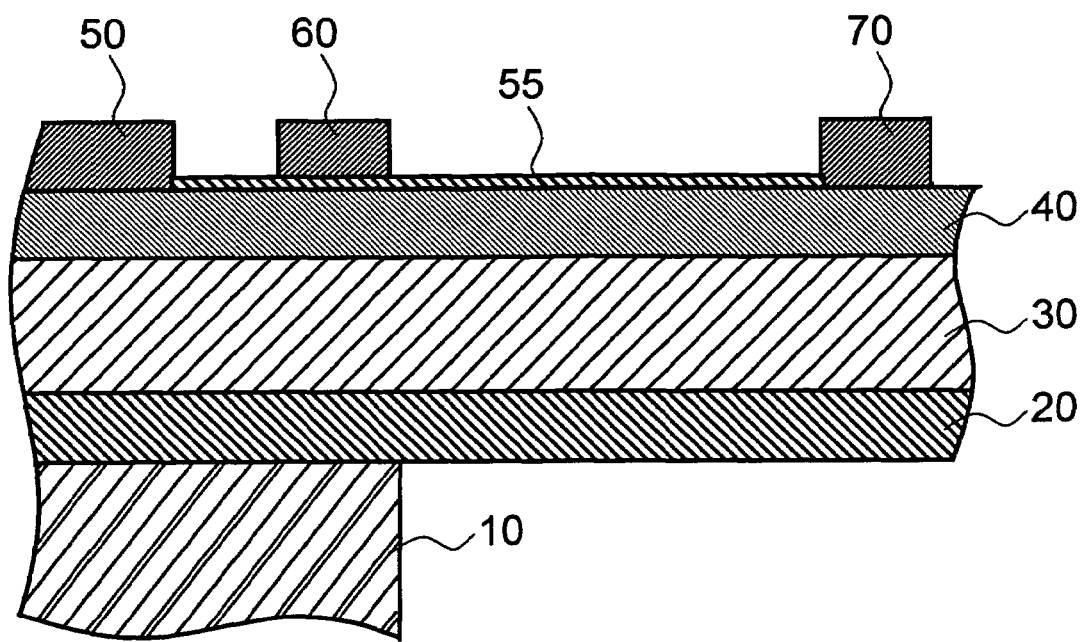
FIG. 20 is a cross section showing a sixteenth example of the nitride semiconductor device in the present embodiment.

FIG. 20 is a cross section illustrating a nitride semiconductor device of the MIS gate type.

Such a nitride semiconductor device of the MIS gate type, which has a gate insulating film 55 between the AlGaN barrier layer 40 and the gate electrode 60, can also achieve similar functions and effects through similar application of the invention.

Furthermore, the invention can also be applied to a nitride semiconductor device based on the so-called "recess gate structure".

Figure 21:
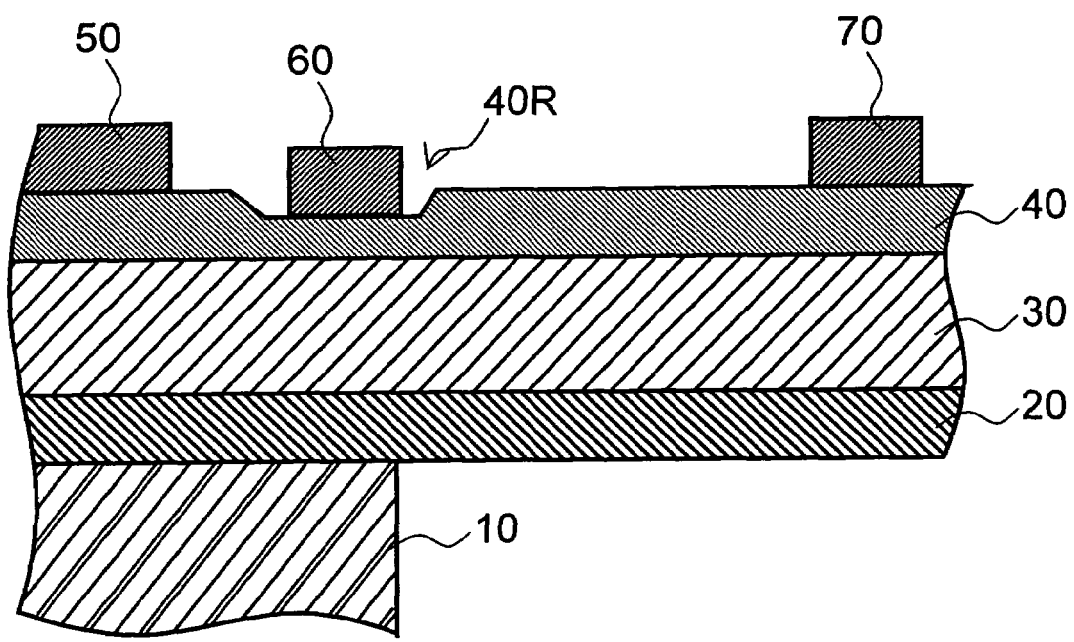
FIG. 21 is a cross section showing a seventeenth example of the nitride semiconductor device in the present embodiment.

FIG. 21 is a schematic view of an example in which the invention is applied to a recess gate type HFET.

In this example, the AlGaN barrier layer 40 has a recess 40R between the source electrode 50 and the drain electrode 70, and the gate electrode 60 is provided so as to be received in the recess 40R.

By decreasing the thickness of the AlGaN barrier layer 40 directly under the gate electrode 60 in this manner, the electron concentration at the heterointerface with the GaN channel layer 30 can be selectively decreased, and the device can be turned off when no gate voltage is applied. That is, a switching device of the so-called "normally-off type" can be achieved, which can prevent short circuit and simplify the gate driving circuit. Moreover, similar functions and effects are also achieved by applying the invention to the structure in which a GaN cap layer is formed on the surface of the AlGaN layer.

The "nitride semiconductor" used herein includes semiconductors having any composition represented by the chemical formula $B_xAl_yGa_zIn_{1-x-y-z}N$ ($0 \leq x \leq 1$, $0 \leq y \leq 1$, $0 \leq z \leq 1$, $x+y+z \leq 1$) where the composition ratios x, y, and z are varied in the respective ranges. Furthermore, the "nitride semiconductor" also includes those further containing any of various impurities added for controlling conductivity types.

The invention claimed is:

1. A nitride semiconductor device comprising:
   a substrate body including a conductive substrate portion and a high resistance portion;
   a first semiconductor layer of a nitride semiconductor provided on the substrate body;
   a second semiconductor layer of a nondoped or n-type nitride semiconductor having a wider bandgap than the first semiconductor layer, the second semiconductor layer being provided on the first semiconductor layer;
   a first main electrode provided on the second semiconductor layer above the conductive portion;
   a second main electrode provided on the second semiconductor layer above the high resistance portion; and
   a control electrode provided on the second semiconductor layer between the first main electrode and the second main electrode,
   wherein a distance between the control electrode and the second main electrode is larger than a sum of a thickness of the first semiconductor layer and a thickness of the second semiconductor layer.

2. A nitride semiconductor device according to claim 1, wherein the conductive substrate portion is electrically connected to the first main electrode.

3. A nitride semiconductor device according to claim 1, wherein the high resistance portion is filled with an insulator.

4. A nitride semiconductor device according to claim 3, wherein the high resistance portion is made of SiO2.

5. A nitride semiconductor device according to claim 1, wherein the conductive substrate portion is made of silicon.

6. A nitride semiconductor device according to claim 1, wherein the high resistance portion is a cavity.

7. A nitride semiconductor device according to claim 1, wherein the control electrode is provided above the high resistance portion.

8. A nitride semiconductor device according to claim 1, wherein a distance between the conductive substrate portion and the second main electrode is larger than a distance between the control electrode and the second main electrode.

9. A nitride semiconductor device according to claim 8, wherein a distance between the control electrode and the second main electrode is larger than a distance between the control electrode and the first main electrode.

10. A nitride semiconductor device comprising:
    a conductive substrate portion;
    a first semiconductor layer provided on the conductive substrate portion, the first semiconductor layer being made of a nitride semiconductor and having a first region into which a high resistance portion is inserted;
    a second semiconductor layer of a nondoped or n-type nitride semiconductor having a larger bandgap than the first semiconductor layer, the second semiconductor layer being provided on the first semiconductor layer;
    a first main electrode provided on the second semiconductor layer above a region outside the first region;
    a second main electrode provided on the second semiconductor layer above the first region; and
    a control electrode provided on the second semiconductor layer between the first main electrode and the second main electrode.

11. A nitride semiconductor device according to claim 10, wherein the conductive substrate portion is electrically connected to the first main electrode.

12. A nitride semiconductor device according to claim 10, wherein the high resistance portion is filled with an insulator.

13. A nitride semiconductor device according to claim 10, wherein the conductive substrate portion is made of silicon.

14. A nitride semiconductor device according to claim 10, wherein the high resistance portion is a cavity.

15. A nitride semiconductor device comprising:
    a conductive substrate having a missing part;
    a first semiconductor layer of a nitride semiconductor provided on the conductive substrate;
    a second semiconductor layer of a nondoped or n-type nitride semiconductor having a wider bandgap than the first semiconductor layer, the second semiconductor layer being provided on the first semiconductor layer;
    a first main electrode provided on the second semiconductor layer;
    a second main electrode provided on the second semiconductor layer above the missing part; and
    a control electrode provided on the second semiconductor layer between the first main electrode and the second main electrode.

16. A nitride semiconductor device according to claim 15, wherein the conductive substrate is electrically connected to the first main electrode.

17. A nitride semiconductor device according to claim 15, wherein a distance between the control electrode and the second main electrode is larger than a sum of a thickness of the first semiconductor layer and a thickness of the second semiconductor layer.

18. A nitride semiconductor device according to claim 17, wherein a distance between the conductive substrate and the second main electrode is larger than a distance between the control electrode and the second main electrode.

19. A nitride semiconductor device according to claim 18, wherein a distance between the control electrode and the second main electrode is larger than a distance between the control electrode and the first main electrode.

* * * * *